(12) United States Patent  
Rzyski

(10) Patent No.: US 6,496,064 B2  
(45) Date of Patent: Dec. 17, 2002

(54) INTERMODULATION PRODUCT CANCELLATION CIRCUIT

(76) Inventor: Eugene Rzyski, 2 Benjamin, Irvine, CA (US) 92620

( * ) Notice: Subject to any disclaimer, the term of this patent is extended or adjusted under 35 U.S.C. 154(b) by 0 days.

(21) Appl. No.: 09/886,939

(22) Filed: Jun. 21, 2001

(65) Prior Publication Data

US 2002/0070803 A1 Jun. 13, 2002

Related U.S. Application Data

(63) Continuation-in-part of application No. 09/639,282, filed on Aug. 15, 2000, now abandoned.

(51) Int. Cl.$^7$ .................................................. H03F 1/26
(52) U.S. Cl. ...................................... 330/149; 330/151
(58) Field of Search .................................. 330/151, 149, 330/52

(56) References Cited

U.S. PATENT DOCUMENTS

| | | | |
|---|---|---|---|
| 4,268,802 A | 5/1981 | Fisher et al. | |
| 4,580,105 A | 4/1986 | Myer | |
| 4,818,996 A | 4/1989 | Kimura | |
| 4,926,134 A | 5/1990 | Olver | |
| 4,992,754 A | 2/1991 | Blauvelt et al. | |
| 5,023,565 A | 6/1991 | Lieu | |
| 5,077,532 A | 12/1991 | Obermann et al. | |
| 5,119,040 A | 6/1992 | Long et al. | |
| 5,157,345 A | 10/1992 | Kenington et al. | |
| 5,323,119 A | 6/1994 | Powell et al. | |
| 5,334,946 A | 8/1994 | Kenington et al. | |
| 5,365,187 A | 11/1994 | Hornak et al. | |
| 5,455,537 A | 10/1995 | Larkin et al. | |
| 5,459,680 A | 10/1995 | Zimmerman et al. | |
| 5,485,120 A * | 1/1996 | Anvari | 330/151 |
| 5,524,281 A | 6/1996 | Bradley et al. | |
| 5,528,196 A | 6/1996 | Baskin et al. | |
| 5,619,168 A | 4/1997 | Myer | |
| 5,621,354 A | 4/1997 | Mitzlaff | |
| 5,623,227 A | 4/1997 | Everline et al. | |
| 5,742,201 A | 4/1998 | Eisenberg et al. | |
| 5,758,275 A | 5/1998 | Cox et al. | |
| 5,808,512 A | 9/1998 | Bainvoll et al. | |
| 5,886,573 A | 3/1999 | Kolanek | |
| 5,892,397 A | 4/1999 | Belcher et al. | |
| 5,903,819 A | 5/1999 | Romesburg | |
| 5,907,624 A | 5/1999 | Takada | |
| 5,917,375 A | 6/1999 | Lisco et al. | |
| 5,994,957 A | 11/1999 | Myer | |
| 6,208,207 B1 * | 3/2001 | Cavers | 330/149 |
| 6,392,481 B1 * | 5/2002 | Kurttio | 330/151 |

* cited by examiner

Primary Examiner—Robert Pascal
Assistant Examiner—Henry Choe
(74) Attorney, Agent, or Firm—MacPherson Kwok Chen & Heid LLP

(57) ABSTRACT

A cancellation circuit is provided for canceling undesirable intermodulation (IM) products in electrical circuitry. The IM cancellation circuit includes a stepping spectrum analyzer which recognizes and measures the frequencies and amplitudes of different signal components of an RF signal across a desired frequency band. This information is forwarded to a processor which contains look-up tables or the like which provides information relating to the frequencies and/or amplitudes of signal components which are intended to reside in the RF signal. By comparison of the look-up tables to the frequencies and amplitudes measured and recognized by the sweeping spectrum analyzer, the processor of the cancellation circuit is able to determine whether the signal components in the RF signal are intended "information" carrying signals or unintended IM products. Where the processor has determined that a signal component is an unintended IM product, the processor controls a variable voltage controlled oscillator and variable amplifier to create a cancellation signal having an identical frequency and amplitude as the frequency and amplitude of the IM product. A phase shifter is provided to shift the phase of the cancellation signal 180 degrees with respect to the IM product and the cancellation signal is combined with the RF signal to produce an output signal having the IM product canceled.

27 Claims, 8 Drawing Sheets

INTERMODULATION PRODUCT CANCELLATION CIRCUIT

REFERENCE TO RELATED APPLICATION

The present application is a continuation-in-part of copending U.S. application Ser. No. 09/639,282 filed Aug. 15, 2000, now abandoned titled "INTERMODULATION PRODUCT CANCELLATION CIRCUIT," the entire contents of which is hereby incorporated by reference in its entirety.

BACKGROUND OF THE INVENTION

1. Field of the Invention

The invention relates to techniques for detecting and canceling intermodulation distortion in amplifiers, including radio frequency amplifiers.

2. Description of the Related Art

The present invention relates to the reduction of distortion in electrical circuitry. More particularly, the present invention relates to distortion reduction circuitry particularly suitable for amplifiers.

Radio frequency (RF) systems, such as cellular and microwave communication systems, typically require input signals to be fed into an RF power amplifier. Unfortunately, all amplifiers tend to distort the input signal at some power level and to generally cause the amplifier output to contain undesirable distortion products, spurious products, noise perturbations and intermodulation (IM) products. For purposes of simplicity, these will collectively be referred to as IM products. These IM products can cause undesirable interference over the amplifier frequency range. It is for these reasons that most amplifiers must incorporate some form of correction mechanism into the signal flow path through the amplifier.

One conventional method for reducing IM products uses a spectral analysis approach. This approach involves scanning the output of the amplifier using a receiver tuned to the frequency of candidate IM products. The IM level is measured and a linearizer is manually adjusted to minimize the IM product. This procedure is repeated until each of the IM products have a magnitude below a predetermined acceptable level. In a similar approach, as described in U.S. Pat. No. 4,580,105 issued to Myer, a portion of the output signal is taken and combined with an input signal which has been adjusted in phase and amplitude. The signal combination isolates the distortion component, which is then adjusted in phase and gain. This isolation distortion component is then added back to the output signal by means of a coupler to eliminate the distortion component. Unfortunately, the amount of distortion reduction available using this feed forward technique is limited by the accuracy of the gain and phase adjustments.

In addition, there appears to be a problem in the number of samples realized in several basic feed forward techniques. Samples in these systems are available only at the time that the phase detector circuit detects a correlated signal. This leads to poor error signal resolution and it is this error signal that is used to cancel corresponding spurs.

Moreover, it is believed that many cellular communication base stations do not function at full capacity because of serious linearity problems in the base station's components. In addition, the need for increased capacity accompanying the expansion of cellular communications is forcing requirements for transmission standards of RF equipment to become too stringent to be met by construction of most present day amplifier circuits. Moreover, both Time Division Multiple Access (TDMA) and Code Division Multiple Access (CDMA) modulation require greater linearity and an absence of IM products that can not be routinely obtained by presently available high efficiency RF power amplifiers. Accordingly, it is clear that present correction techniques for eliminating IM products are not acceptable for evolving communications systems.

Thus, there is a need for a cancellation circuit that reduces IM products in electronic circuitry such as power amplifiers.

It would also be highly advantageous if the IM cancellation circuit were inexpensive to manufacture and highly reliable.

Moreover, it would be highly advantageous if the IM cancellation could be provided in a compact and lightweight constriction.

SUMMARY

Briefly, in accordance with the invention, I provide an improved apparatus and method for automatically reducing IM products in electrical circuits. It is believed that this IM cancellation circuit is particularly suitable for application with amplifiers that amplify an input carrier signal.

In its most basic form, the IM product cancellation circuit includes a first coupler for sampling an input carrier signal. The coupler isolates a portion of the signal, preferably 6 dB below the input carrier signal so as to not substantially affect the energy level of the input carrier signal. This sample signal is then routed to a stepping spectrum analyzer which detects and measures the frequency and amplitude of the signal components of the carrier signal including its intended components and any IM products in the carrier signal. The stepping spectrum analyzer transmits the information relating to the frequency and amplitude of the different signal components in the carrier signal to a processor. Meanwhile, the processor stores information relating to the identity of the amplitude and/or frequency or frequency bands of intended signal components in the carrier signal. This information is typically in the form of look-up tables which identifies the amplitude or frequency, or in the case of TDMA or CDMA systems, the frequency band where the intended signal components are expected to reside. In this manner, the processor, by referencing this look-up table, can determine whether the signal components detected and measured by the stepping spectrum analyzer are intended signal components or unintended IM products.

The IM product canceling circuit further includes a variable voltage controlled oscillator, variable amplifier and variable phase shifter. The voltage controlled oscillator, amplifier and phase shifter are connected in series for creating an oscillator signal which can be controlled in amplitude and phase. The operation of the voltage controlled oscillator, amplifier and phase shifter are all controlled by the processor. Upon recognition and measurement of an IM product by the stepping spectrum analyzer and processor, the processor controls the voltage controlled oscillator, amplifier and phase shifter to produce an oscillating signal which is substantially identical in amplitude and frequency to a detected IM product but shifted in phase by 180 degree. This oscillating signal acts as an IM cancellation signal as the signal is fed back into the original carrier signal by means of a coupler or the like, such as a combiner. The original carrier signal is then output from the coupler retaining all of the original characteristics of the intended signal components except that the unintended IM product is canceled by the cancellation signal.

In a preferred embodiment, the IM cancellation circuit includes a feedback circuit. After the IM product is canceled, the output carrier signal is sampled by splitting the output signal with a coupler or the like to produce a sample of the output carrier signal. This sample of the output carrier signal is routed back to, in turn, the stepping spectrum analyzer and processor. The stepping spectrum analyzer and processor are thus able to confirm that the IM product has been canceled. In the alternative, where it has been determined that the cancellation signal is being transmitted at an incorrect frequency, amplitude or phase, the voltage controlled oscillator, amplifier and phase shifter are automatically adjusted by the processor until the cancellation signal correctly cancels the unintended IM product.

As would be understood by those skilled in the art, the aforementioned described cancellation circuit would only cancel a single unintended IM product. Where the carrier signal is likely to have more than one unintended IM product, the cancellation circuit is provided with a plurality of variable voltage controlled oscillators, variable amplifiers and variable phase shifters. Each set of these voltage controlled oscillators, amplifiers and phase shifters are connected in series to the processor for creating a plurality of cancellation signals where necessary.

In an additional preferred embodiment, the IM product cancellation signal is adapted for use with an amplifier. A portion of the output from the amplifier is forwarded to the stepping spectrum analyzer for recognition and measurement of not only the intended signal components but also any IM products. This information is sent to the processor which determines whether the signals received by the stepping spectrum analyzer are intended signal components or unintended IM products. Whether the carrier signal includes IM products can be determined by comparison of the received signals to look-up tables, which identify the amplitude and/or frequency band of the intended signal components. If a detected signal is not listed in the look-up table, the signal is recognized as an IM product.

In an additional embodiment, the amplifier input signal is split with a first component going to the amplifier and a second component, typically 6 dB below the signal input to the amplifier, being sent to the stepping spectrum analyzer for analysis. The frequencies of signals originally input in the amplifier are identified as intended signal components and stored in the processor. The frequencies of the intended signal components are then compared with the frequencies of signals output from the amplifier. IM products can then be identified as appearing at frequencies not appearing in the amplifier input signal. The processor then controls the variable voltage controlled oscillator and variable amplifier to produce a cancellation signal having a frequency and amplitude substantially equal to the frequency and amplitude of the IM product. The cancellation signal is then shifted in phase 180 degree with respect to the phase of the IM product and combined with the carrier signal by means of a coupler or the like. The resulting carrier signal is thus "cleansed" with the IM product removed.

In still an additional preferred embodiment, the amplifier circuit includes a traditional feed forward correction circuit. The feed forward correction circuit will typically cancel much of the noise and IM products of an amplifier. However, the components of the feed forward correction circuit, such as combiners, amplifiers and phase shifters, etc., typically add additional IM products to the amplifier output. These IM products can be canceled by application of the IM cancellation circuit of the present invention. As described above, the output signal from the amplifier is split with a component going to the stepping spectrum analyzer. IM products are then recognized by the processor by use of a look-up table or by comparison to an analysis of the original amplifier input signal. The processor then controls the variable controlled oscillator, variable amplifier and variable phase shifter to produce a cancellation signal substantially equal in frequency and amplitude to the IM product but shifted in phase by 180 degree. This cancellation signal is then combined with the amplifier output signal to cancel the unintended IM product.

A preferred embodiment of the stepping spectrum analyzer for use in application with the present invention is substantially similar to the automated frequency stepping noise measurement test system disclosed and described in copending U.S. patent application Ser. No. 09/313,435 which is incorporated by reference herein. In a preferred embodiment, the stepping spectrum analyzer includes a variable low noise source for producing a low noise signal having an adjustable frequency. The variable low noise source includes two outputs for outputting identical low noise signals, or is coupled to a splitter for splitting a low noise signal into two identical low noise signals. The first low noise signal is routed to a coupler that combines the first low noise signal with that portion of the input carrier signal comprising the sample signal. The second low noise signal is routed to a variable phase shifter, which adjusts the phase of the second low noise signal to be 90 degrees out of phase (in phase quadrature) with respect to the first low noise signal which has been combined with the sample signal. The sample signal, carrying the intended carrier signal components and any unintended IM products, and the first low noise signal are then sent together to a mixer where the signal is mixed with the second low noise signal which has been adjusted in phase. Due to the inherent characteristics of a mixer, the low noise source signals are canceled in the mixer output signal by having the second low noise signal shifted in phase 90 degrees with respect to the first low noise signal. Moreover, the mixer is nonlinear producing an output signal including only a single sideband with respect to the frequency of the low noise signal but having double the amplitude. The signal output from the mixer, hereinafter referred to as a "measurement test signal", is then sent to a variable low noise matching amplifier. The variable low-noise matching variable-gain amplifier both amplifies the measurement test signal and acts as a buffer. The matching variable-gain amplifier is constructed to add very low noise or IM products so as to not interfere with the IM measurements by the stepping spectrum analyzer and provides for amplification of the measurement test signal to enhance the ability of the stepping spectrum analyzer to measure any IM products in the original sample signal.

After passing through the low-noise matching amplifier, the measurement test signal is sent to an analog-to-digital converter (ADC) which converts the analog measurement test signal into digital data. The digital data is then transmitted to a processor for evaluation. The processor of the stepping spectrum analyzer may be separate and independent from the processor which controls the variable voltage controlled oscillator, variable amplifier and phase shifter which creates the IM product cancellation signal, or both processor functions may be combined in a single processor. The processor of the stepping spectrum analyzer uses standard, windowed, fast or discreet Fourier transforms to accurately measure the characteristics of the measurement test signal and whether it includes any IM products. These Fourier transforms are known to those skilled in the art and will not be discussed in detail herein.

The processor of the stepping spectrum analyzer is connected to a plurality of control lines to the variable amplifier, variable low noise source, variable phase shifter and variable low noise matching amplifier. These control connections enable the processor to automatically set levels and make adjustments to the amplifier, low noise source, phase shifter and matching amplifier to "step" the low noise source across a desired frequency band at different offset frequencies in order to identify the IM products in that frequency band. To control the stepping spectrum analyzer, the processor takes the digitized output from the ADC to both calibrate the system and to ensure that the amplifier, low noise source and phase shifter are set to correct levels. More particularly, the output from the ADC enables the processor to determine whether the low noise source is providing the first and second low noise signals at a correct frequency.

By evaluating the output from the ADC, the processor can also confirm that the phase shifters are properly maintaining the signals received by the mixer in phase quadrature. If any of these components are not functioning optimally, the processor automatically makes required adjustments to ensure proper recognition and measurement of any IM products in the carrier signal. Once the frequency characteristics are recognized and measured by the stepping spectrum analyzer, this signal information is sent to the processor which controls the variable voltage controlled oscillator, variable amplifier and variable phase shifter which produce the cancellation signal. This processor (by comparison of the signal information to internal look-up tables) determines whether the carrier signal is carrying any unintended IM products and controls the variable controlled oscillator, variable amplifier and variable phase shifter to produce a cancellation signal which is combined with the carrier signal to cancel an unintended IM product.

In one embodiment, phase shifters are provided in relatively lower-power circuit paths rather than relatively higher-power circuit paths in order to allow relatively lower-power phase shifters to be used.

It is thus an object of the present invention to provide an improved apparatus and method for canceling IM products in electronic circuitry.

It is an additional object of the present invention to provide an IM cancellation circuit which is inexpensive to manufacture, highly reliable, compact and of lightweight construction.

These and other further advantages of the present invention will be appreciated by those skilled in the art upon reading the following detailed description with reference to the attached drawings.

DETAILED DESCRIPTION

Figure 1:
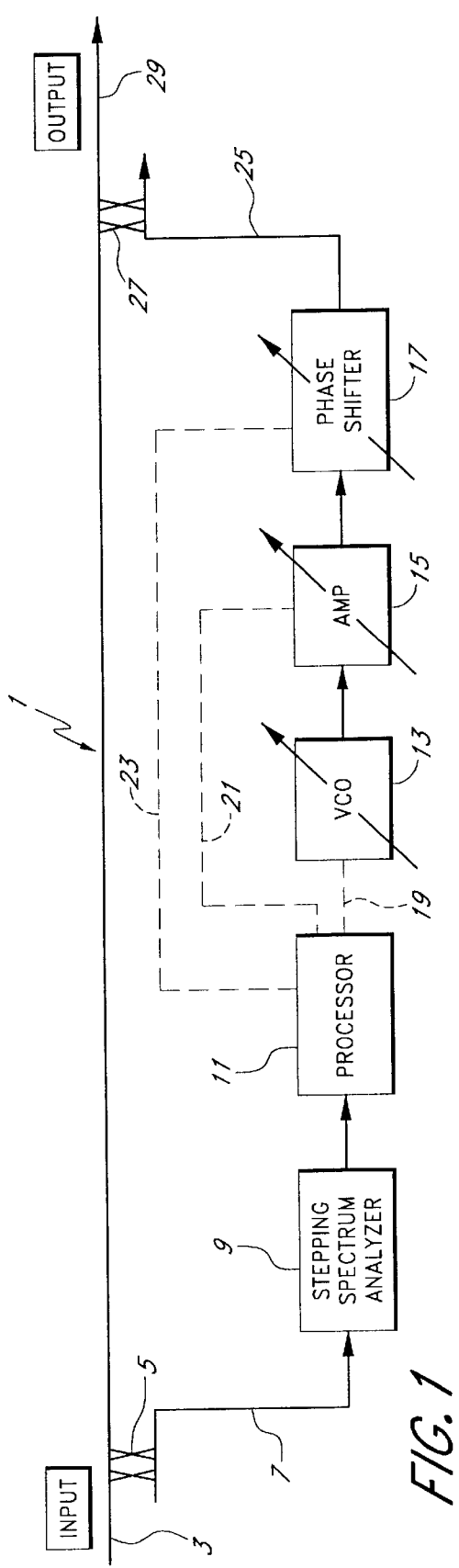
FIG. 1 is a diagram showing a simplified IM product cancellation circuit of the present invention.

While the present invention is susceptible of embodiment in various forms, there is shown in the drawings and will hereinafter be described the presently preferred embodiments of the invention with the understanding that the present disclosure is to be considered as an exemplification of the invention and is not intended to limit the invention to the specific embodiments illustrated.

Figure 6:
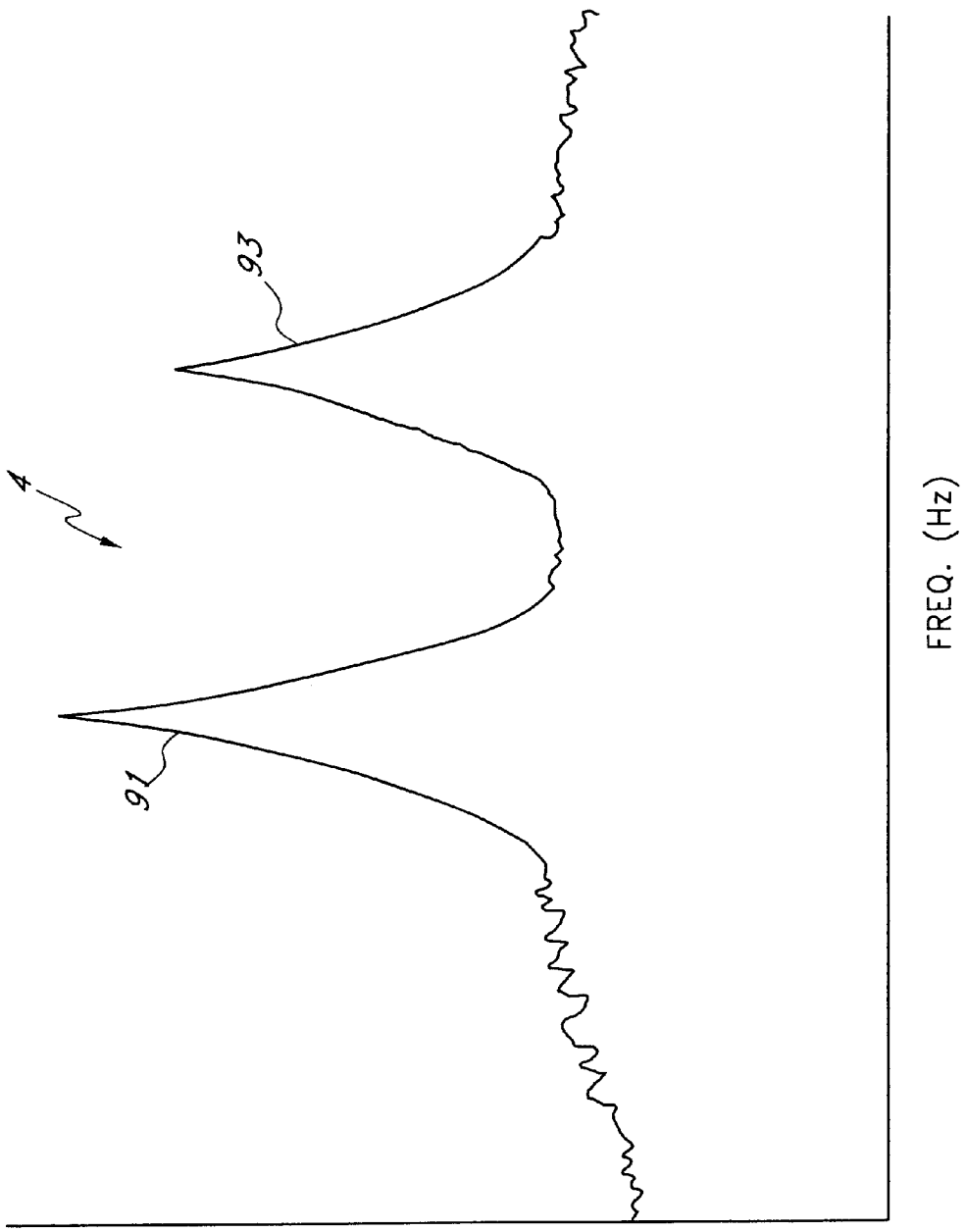
FIG. 6 is a graphical depiction, as would be shown on the display of a traditional spectrum analyzer, illustrating a carrier signal carrying both an intended signal and an unintended IM product.

With reference to FIGS. 1 & 6, the IM product cancellation circuit 1 of the present invention includes a stepping spectrum analyzer 9, a processor 11, a variable voltage controlled oscillator 13, variable amplifier 15 and variable phase shifter 17. A carrier signal 4 which is intended to have its IM products canceled is received by an input 3. The carrier signal is then split by a coupler 5 with a portion, typically 6 dB below the input carrier signal, being sent to the stepping spectrum analyzer 9. The signal sent to the stepping spectrum analyzer 9, hereinafter referred to as a sample signal 7, is analyzed by the stepping spectrum analyzer 9 for detection and measurement of the frequency and amplitude of signal components in the input carrier signal. These signal components which comprise the carrier signal 4 include both intended signal components 91 and any unintended IM products 93 (See FIG. 6). Once the stepping spectrum analyzer 9 has stepped across a frequency band of interest and recognized the frequency and amplitude of the different signal components of the carrier input signal within that frequency band, this information is sent to the processor 11.

The processor 11 stores information relating to the identity of the frequency and/or frequency bands within which the intended signal or signals are expected to reside within the carrier input signal. This information relating to the intended signal components is typically stored in the form of look-up tables which identifies the amplitude or frequency or frequency band where the intended signal components of the carrier input signal 4 are intended to be located within. The processor 11, by cross referencing the information provided by the stepping spectrum analyzer 9 relating to recognized signals in the carrier input signal 4 with the information stored in the look-up table, can determine whether there are any unintended IM products within the carrier input signal 4. Simply, any signal components identified by the stepping spectrum analyzer 9 which are not listed by amplitude frequency in the processor lookup table are determined to be IM products 93.

Figure 7:
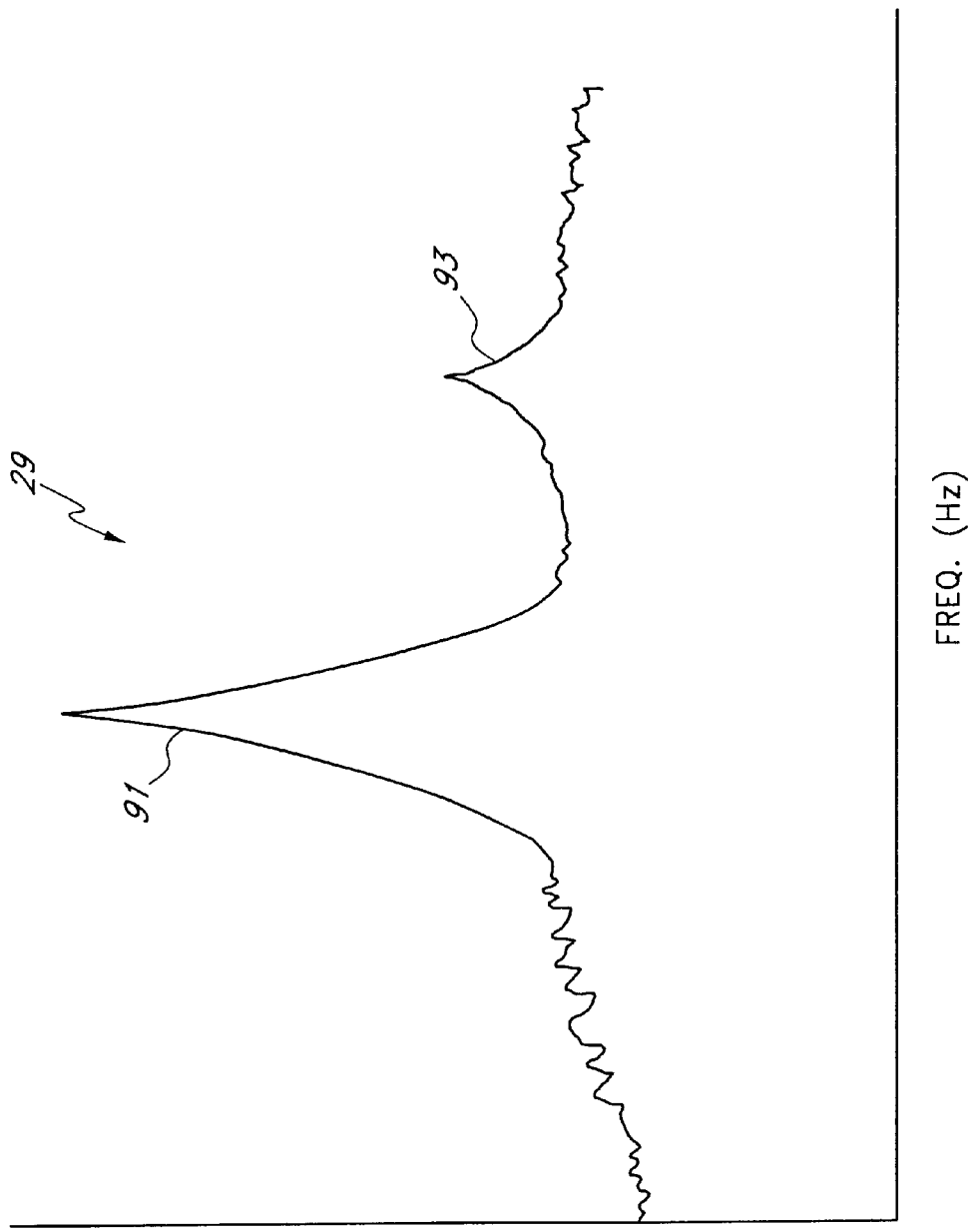
FIG. 7 is a graphical depiction, as would be shown on the display of a traditional spectrum analyzer, illustrating the carrier signal shown in FIG. 6 with the IM product being substantially canceled by application of the IM product cancellation circuit of the present invention.

The IM product cancellation circuit 1 of the present invention further includes a plurality of control lines 19, 21 and 23 which connect the processor 11 with the variable voltage controlled oscillator 13, variable amplifier 15 and variable phase shifter 17, respectively. By means of these control lines 19, 21 and 23, the processor 11 instructs the variable voltage controlled oscillator 13 and variable amplifier 15 to create an oscillating signal which is identical in frequency and amplitude to a detected unintended IM product. This oscillating signal acts as a cancellation signal 25 which is adjusted in phase by the variable phase shifter 17 to be 180 degree. with respect to the phase of the IM product in the carrier input signal 4. With reference also to FIG. 7, the cancellation signal 25 is then combined with the original carrier input signal 4 by a second coupler 27 or the like to create an output signal 29. As would be understood by those skilled in the art, the output signal 29 is identical to the original carrier input signal 4, retaining all of its original frequency and amplitude characteristics of the intended signal components 91, except that the unintended IM product 93 has been canceled by the cancellation signal 25.

Figure 2:
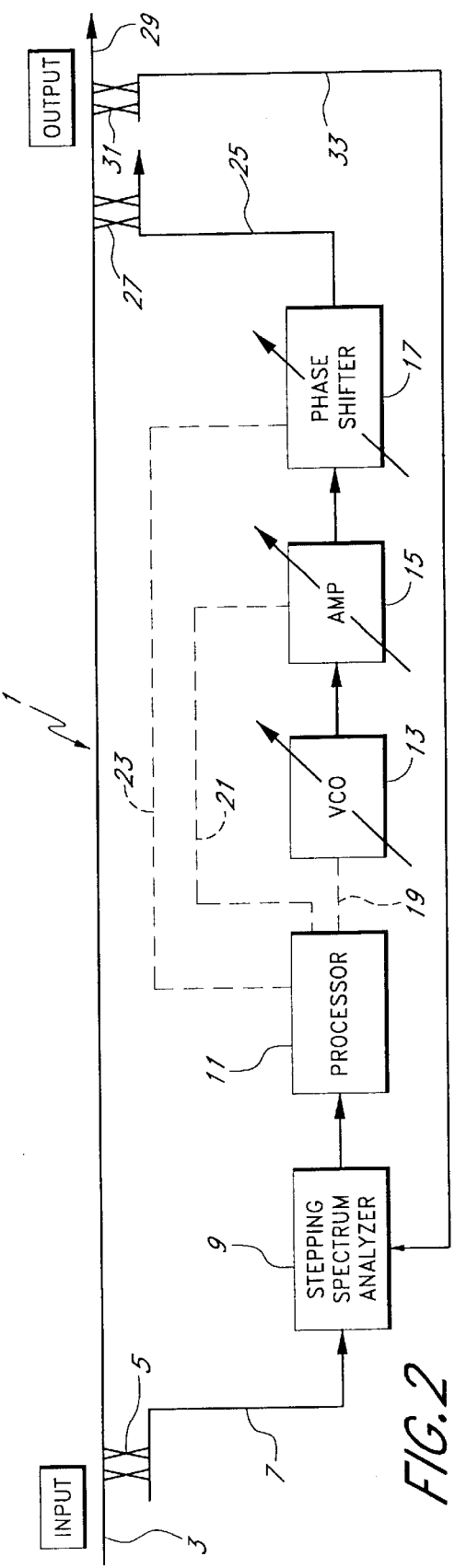
FIG. 2 is a diagram showing the IM product cancellation circuit of the present invention including a feedback circuit.

With reference to FIG. 2, in a preferred embodiment, the IM product cancellation signal 1 includes an additional feedback circuit which includes a third coupler 31 creating a feedback signal 33. After the IM product is canceled by combining the cancellation signal 25 with the carrier input signal 4, the resulting output signal 29 is split by a coupler 31 or the like which isolates a portion of the output signal 29, again preferably 6 dB below the output signal 29 so as to create feedback signal 33. The feedback signal 33 is then routed back to the stepping spectrum analyzer 9 wherein it is analyzed across the desired frequency band to confirm that the previously detected IM product has been properly canceled. Where the IM product has not been properly canceled, the processor 11 can adjust the variable voltage controlled oscillator 13, variable amplifier 15 and/or variable phase shifter 17 to ensure that the cancellation signal 25 has the proper frequency, amplitude and phase shift to properly cancel the IM product in the carrier input signal 4.

Figure 3:
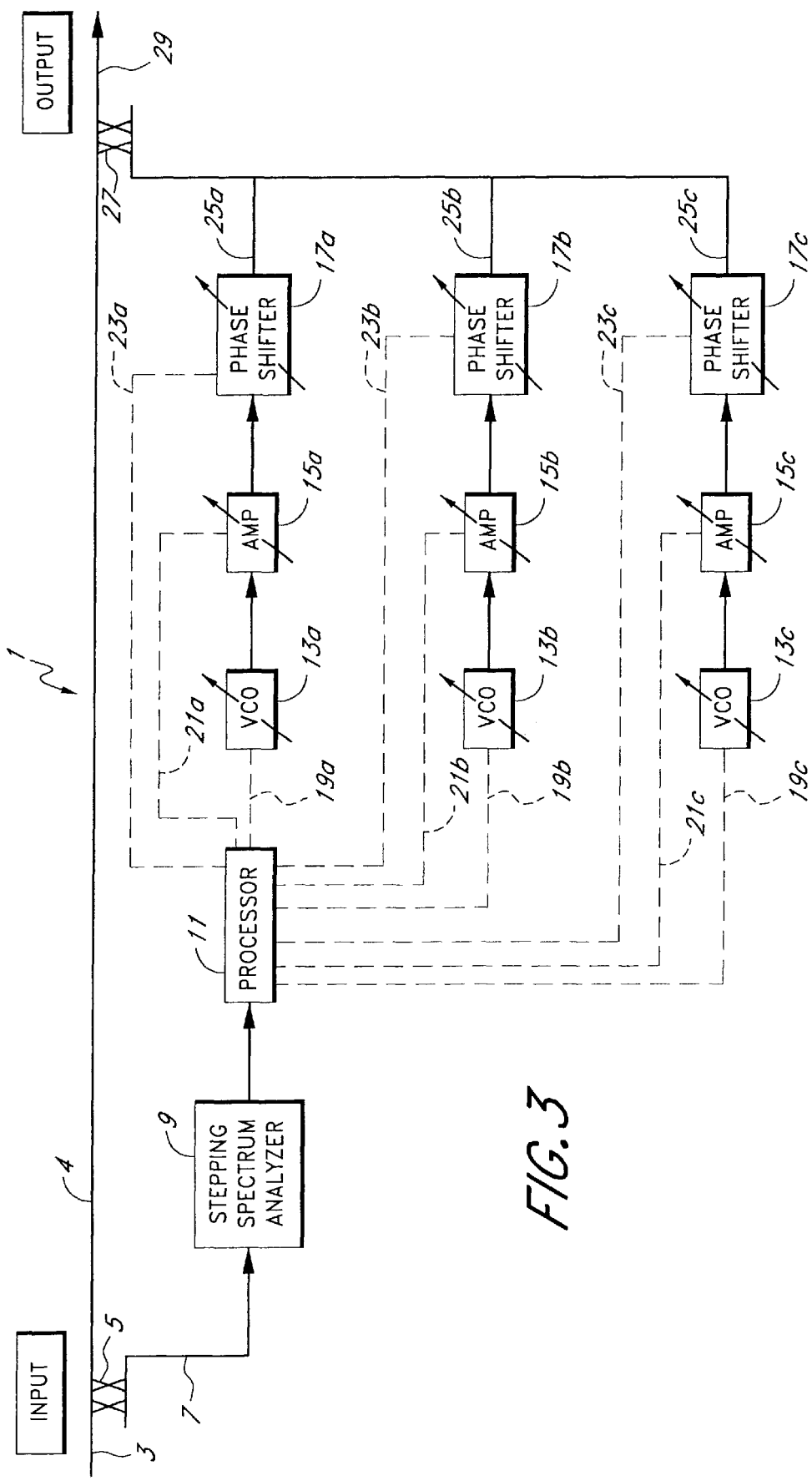
FIG. 3 is a diagram illustrating the IM product cancellation circuit of the present invention including a plurality of variable voltage controlled oscillators, variable amplifiers and variable phase shifters for producing a plurality of IM product cancellation signals.

The previously described IM product cancellation circuit 1 is only capable of canceling a single unintended IM product. With reference to FIG. 3, in a preferred embodiment, the cancellation circuit 25 includes a plurality of variable voltage controlled oscillators 13a–c, variable amplifiers 15a–c and variable phase shifters 17a–c. Each set of variable voltage controlled oscillators 13a–c, variable amplifiers 15a–c and phase shifters 17a–c are connected in series and connected to the processor 11 by control lines 19a–c, 21a–c and 23a–c for enabling the processor 11 to create a plurality of controllable oscillating signals which can be adjusted in amplitude by the variable amplifiers 15a–c and phase by the variable phase shifters 17a–c. For example, FIG. 3 shows three (3) sets of variable controlled oscillators 13a–c, variable amplifiers 15a–c and variable phase shifters 17a–c which are capable of producing three (3) cancellation signals 25a–Where the stepping spectrum analyzer 9 and processor 11 have measured and recognized three (3) IM products, the variable voltage controlled oscillators 13a–c and variable amplifier 15a–c are adjusted to produce three (3) cancellation signals 25a–c having the same frequency and amplitude as the three IM products recognized by the stepping spectrum analyzer 9 and processor 11. These cancellation signals 25a–c are then individually shifted in phase by phase shifters 17a–c so that they are each shifted 180 degree. with respect to the IM product with which they are intended to cancel. Each of these cancellation signals 25a–c are then coupled back to the carrier input signal 4 to create an output signal 29. Again, the output signal 29 includes all of the signal characteristics of the carrier input signal 4 except that the three (3) detected IM products have now been canceled.

Figure 5:
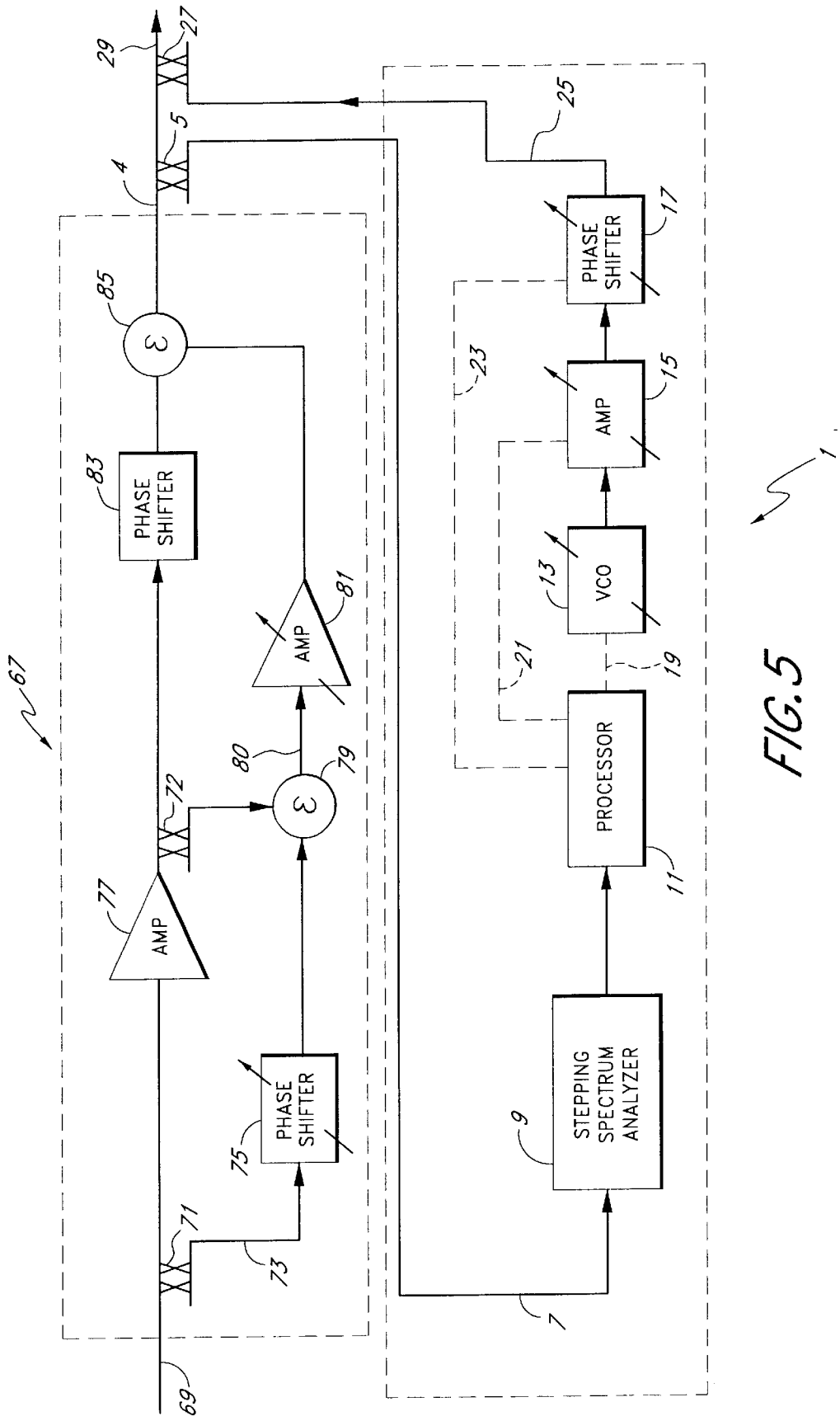
FIG. 5 is a diagram illustrating an amplifier circuit incorporating a traditional feed forward correction circuit and an IM product cancellation circuit of the present invention.

The IM product cancellation circuit 1 of the present invention is believed to be particularly applicable to the cancellation of IM products in amplifiers. Typically, amplifiers use some sort of Feed Forward Correction Circuit (FFCC) in an effort to cancel the IM products created by an amplifier. Unfortunately, though a feed forward correction circuit often substantially cancels the IM products of the amplifier itself, the feed forward correction circuit introduces additional IM products as a result of the additional components of the feed forward correction circuit, such as phase shifters, variable amplifiers and combiners. These IM products are then output as part of the amplifier output signal. With reference to FIG. 5, the IM product cancellation circuit 1 of the present invention can be used to cancel the IM products of a feed forward correction circuit 67 employed to cancel the IM products of a primary amplifier 77. For purposes herein, the term "primary amplifier" is intended to be used in the broadest sense to include any amplifiers, such as RF amplifiers, IF amplifiers, power amplifiers, etc. A primary amplifier 77 employing a feed forward correction circuit 67 typically includes additional phase shifters 75 and 83, a variable amplifier 81 and combiners 79 and 85. An input signal 69 is split by a coupler 71 with a first portion of the input signal 69 being shifted 190 degrees by phase shifter 75 and sent to a combiner 79. The predominant portion of the input signal 69 is routed to the primary amplifier 77 and amplified accordingly. A portion of this amplified signal, including any IM products, is isolated by an additional coupler 72 and also sent to combiner 79. The portion of the amplified signal which is sent to the combiner 79 is combined with the phase shifted input signal 73 in the combiner 79 which results in a first combiner output signal 80. The original signal components of signal 69 are substantially canceled and instead the first combiner output signal 80 includes only the IM products of the amplifier 77. Meanwhile, the amplifier output signal is phase shifted by 180 degree by the second phase shifter 83 and sent to a second combiner 85. This phase shifted amplifier signal is mixed with the first combiner output, which includes only the IM products created by the amplifier. This first combiner output is adjusted in amplification by amplifier 81 to have substantially the same amplitude as the IM products of the amplifier output signal. Because the amplifier output signal has been phase shifted by 180 degree by the phase shifter 83, the IM products of the primary amplifier are substantially canceled in output carrier signal 4.

With reference to FIGS. 1, 5, 6 & 7, in order to cancel the additional IM products created by the components of feed forward correction circuit 67, the carrier signal 4, output by the feed forward correction circuit, is split by a coupler 5 with a portion of the output signal 7 being sent to the stepping spectrum analyzer 9. The stepping spectrum analyzer 9 steps across a desired frequency band in an effort to recognize the intended signal components 91 and unintended IM products 93 of the carrier signal 4. In similar manner to as described above, the stepping spectrum analyzer 9 forwards the information regarding the frequency and amplitude of the different signals that were recognized in the carrier signal 4 to the processor 11 which cross references this information with an internal look-up table which stores information regarding the frequency of the intended output signals of the amplifier 77. Any signals uncovered by the stepping spectrum analyzer 9 which are not listed in this internal look-up table are thus determined to be unintended IM products. Upon recognition of these unintended IM products 93, the processor 11 controls the variable voltage controlled oscillator 13 and variable amplifier 15 to create a cancellation signal 25. The phase shifter 17 then shifts the phase of the cancellation signal 25 by 180 degree with respect to the IM products of the carrier signal 4 and the cancellation signal 25 is thereafter combined back with the carrier signal 4 to create an output signal 29. Because the cancellation signal 25 has the same frequency and amplitude as the IM products 93 but a shift of phase of 180 degree., the output signal 29 includes all of the frequency and amplitude characteristics of the intended signal components 91 of the signal created by the amplifier 77 but the unintended IM products 93 have been canceled.

With reference to FIG. 5, in an additional preferred embodiment, prior to the input signal 69 being received by the amplifier 77 or the feed forward correction circuit 67, the input signal 69 is split by a coupler (not shown) for isolating a portion of the input signal (not shown). This portion of the input signal is then forwarded to the stepping spectrum analyzer 9 for analysis which forwards the results, including determination of frequency and amplitude components of input signal 69, to the processor 11 which stores this information in look-up tables or the like to provide the processor 11 with information relating to the intended frequency and amplitude characteristics of the input signal 69. Since this information does not include any of the IM products created by the amplifier 77 or feed forward correction circuit 67, the sample signal 7 can be compared with the information now stored in the look-up table to identify the IM products of the carrier signal 4 which were created by the amplifier 77 or feed forward correction circuit 67. This information can, in turn, be used to control the variable voltage controlled oscillator 13, variable amplifier 15 and variable phase shifter 17 to create a cancellation signal 25.

Figure 4:
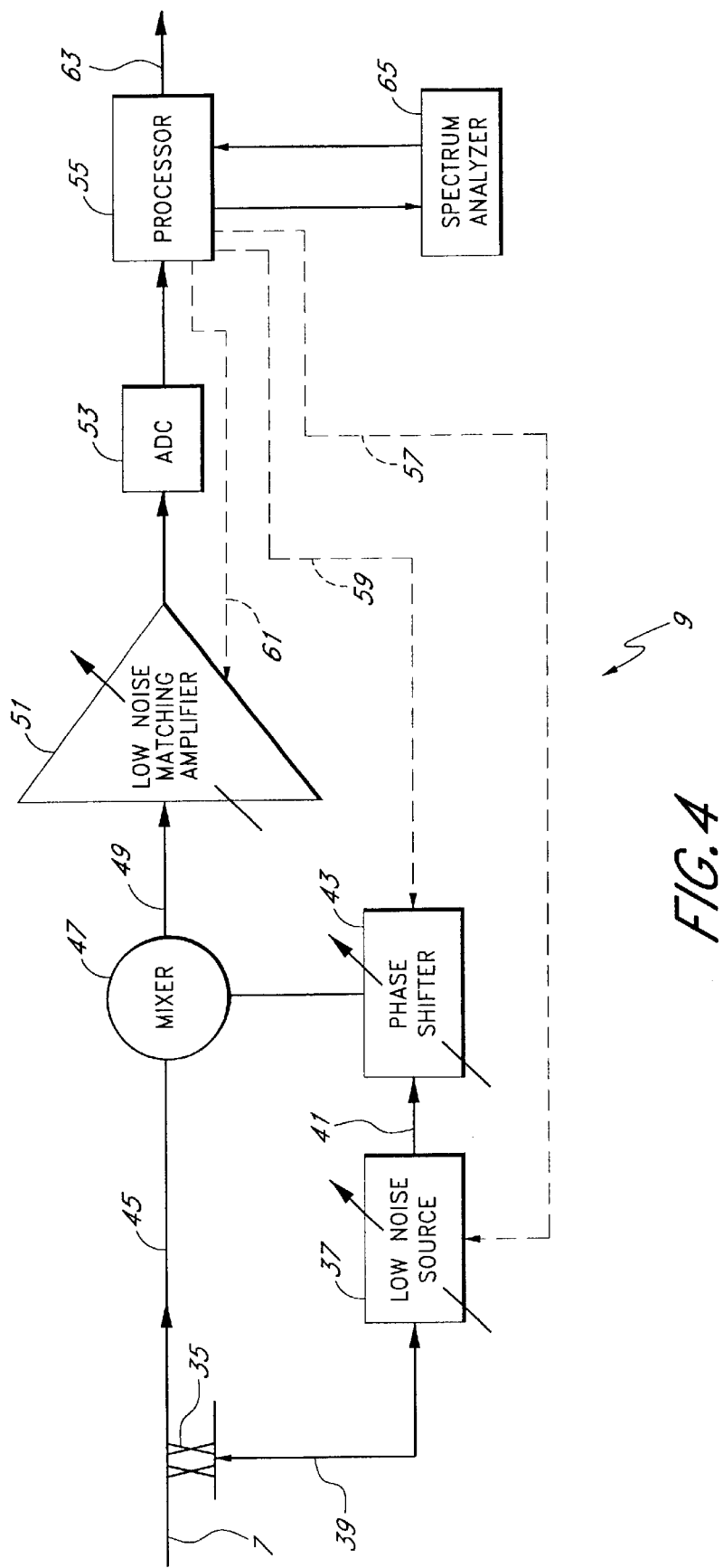
FIG. 4 is a diagram illustrating a preferred embodiment of the stepping spectrum analyzer utilized by the IM product cancellation circuit of the present invention.

As would be understood by those skilled in the art, it is important that the stepping spectrum analyzer 9 quickly and thoroughly analyze a frequency band of interest to determine the frequency and amplitude of the different signal components of a carrier signal, particularly any unintended IM products. Referring to FIG. 4, a preferred stepping spectrum analyzer 9 includes a variable low noise source 37, variable phase shifter 43 and mixer 47. The variable low noise source 37 creates first and second adjustable oscillating signals 39 and 41 which are identical in frequency and amplitude. The first low noise signal 39 is combined with the sample signal 7 by a coupler 35 to create a combined sample signal/low noise signal 45. Meanwhile, the second low noise signal 41 is shifted in phase by 90 degrees by a phase shifter 43. The sample signal/low noise signal 45 and second low noise signal 41 are combined in a mixer 47 to create a mixer output signal 49. Due to the inherent characteristics of the mixer 49, the low noise source signals 39 and 41 are canceled and the remaining signal components appear in the form of "offset-from-carrier". Basically, the signal components in the mixer output signal 49 have been quadrature downconverted to baseband. For example, if the low noise source signals 39 and 41, acting as carrier signals are produced at 500.000 MHz, then a signal component in the sampling signal 7 of 500.050 MHz would appear as a signal of 50 kHz in the mixer output signal 49. This mixer output signal 49, hereinafter referred to as a measurement test signal, is sent to a low noise matching amplifier 51 which amplifies the magnitude of the measurement test signal 49 so that any IM products in the signal can be more easily recognized and measured. Moreover, the low noise matching amplifier 51 acts as a buffer to ensure that the impedance is optimally maintained between the mixer 47 and an analog-to-digital converter 53 which receives the measurement test signal 49 after it has passed through the low noise matching amplifier 51.

The analog-to-digital converter 53 receives the measurement test signal 49 and converts the test signal in a first-in, first-out manner into a digital format. This digital information is then forwarded to a processor 55. The stepping spectrum analyzer 9 further includes a plurality of control lines 57, 59 and 61 which connect the processor 55 to the variable low noise source 37, variable phase shifter 53 and low noise matching amplifier 51, respectively. In operation, the processor 55 adjusts the low noise source 37 and phase shifter 53 across a desired frequency band at different offset frequencies so as to produce different carrier signals which are received by the mixer 47. Though typical spectrum analyzing systems require manual adjustments of a low noise source and phase shifter, the stepping spectrum analyzer 9 of the present invention provides for automatic control of these components so that the intended signal components and unintended IM products of the sample signal 7 can be recognized and measured across an entire bandwidth of interest.

Still with reference to FIG. 4, after reaching the processor 55, the measurement test signal 49 is routed to a spectrum analyzer 65. The measurement test signal 49, now in digital format as converted by the analog-to-digital converter 53, is analyzed by the spectrum analyzer 65 using discreet Fourier transforms that accurately measure the different frequency components of the sample signal 7 including the frequency and amplitude of any intended signal components and any unintended IM products. This information is then sent back to the processor 55 and, with reference to FIG. 1, to the processor 11 which controls the variable voltage controlled oscillator 13, variable amplifier 15 and variable phase shifter 17. The processor 11 then takes this information and determines whether the frequency components are intended signal components or unintended IM products by comparison to an internal look-up table. Once the IM products have been defined, the variable controlled oscillators 13, variable amplifiers 15 and phase shifters 17 are adjusted through control links 19, 21 and 23 by the processor 11 to create cancellation signal 25 which is combined with carrier signal 4 to create an output signal 29 having an unintended IM product being canceled. As would be understood by those skilled in the art, processors 11 and 15 may be constructed as separate processors or combined in a single processor.

Figure 8:
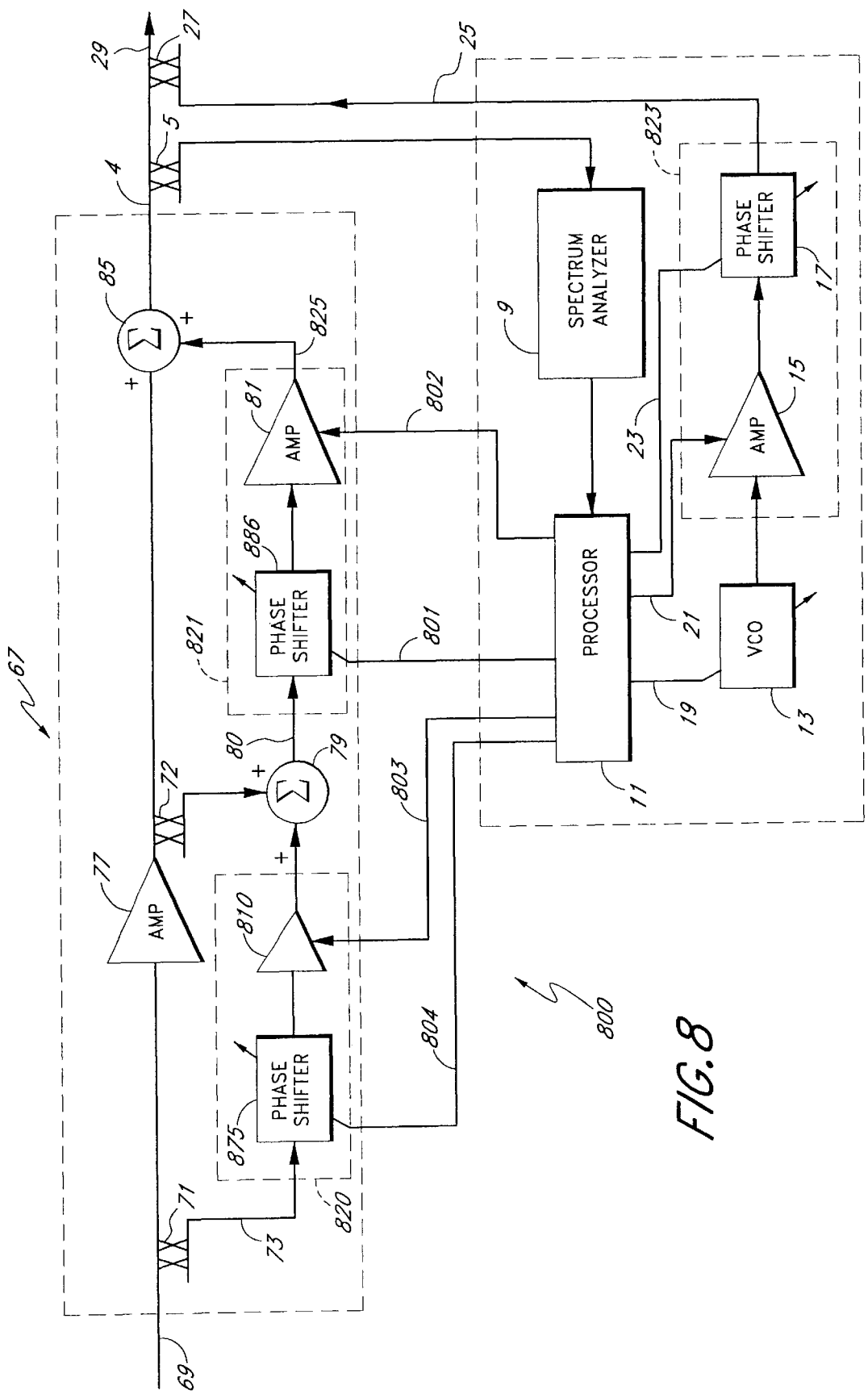
FIG. 8 is a block diagram shown an IM product cancellation system that uses relatively lower-power phase shifters.

FIG. 8 is a block diagram showing an IM product cancellation system 800 that uses relatively lower-power phase shifters. The system 800 is similar in many respects to the IM cancellation system shown in FIG. 5. In the cancellation system 800, the coupler 71 splits the input signal 69 into first and second portions. The first portion of the input signal 69 is provided to an input of a variable phase shifter 875. An output of the variable phase shifter 875 is provided to an input of a variable-gain amplifier 810. An output of the variable-gain amplifier 810 is provided to a first input of the combiner 79. The second portion of the input signal 69 is provided to an input of the primary amplifier 77 and amplified accordingly. An output of the primary amplifier 77 is provided through the coupler 72 to a first input of the combiner 85. The coupler 72 provides a portion of the amplified signal, including any IM products created by the amplifier 77, to a second input of the combiner 79. The output of the combiner 79 is a first combiner output signal 80.

The first combiner output signal 80 is provided to an input of a variable phase shifter 886. An output of the variable phase shifter 886 is provided to an input of the variable-gain amplifier 81. An output of the variable-gain amplifier 81 is a cancellation signal 825. The cancellation signal 825 is provided to the second input of the combiner 85. An output of the combiner 85 is the signal 4 that is provided through the coupler 5 to the coupler 27. An output of the coupler 27 is the output signal 29. The combiners combine two or more signals to produce an output signal that is the vector sum of the two input signal. Thus, the combiners can be implemented as adders, couplers, etc.

The coupler 5 couples a relatively small portion of the output signal 4 to an input of the spectrum analyzer 9. An output of the spectrum analyzer 9 is provided to an input of the processor 11.

An output of the VCO 13 is provided to an input of the adjustable-gain amplifier 15. An output of the adjustable-gain amplifier 15 is provided to an input of the variable phase shifter 17. An output of the variable phase shifter 17 is provided to the coupler 27 to be combined with the output of the coupler 5. The output of the coupler 27 is the output signal 29. Through control outputs, the processor 11 controls the phase of the variable phase shifters 875, 886 and 17, the gain of the variable-gain amplifiers 81 and 15, and the frequency of the VCO 13.

One of ordinary skill in the art will recognize that the variable gain amplifiers 810, 81 and/or 15 can have a gain that is less than unity, unity, or greater than unity. One of ordinary skill in the art will also recognize that the variable gain amplifiers 810, 81 and/or 15 can be replaced by variable attenuators when a gain greater than unity is not needed to produce the desired signal levels. The variable phase shifter 875 and the variable gain amplifier 810 together form a variable amplitude-phase module 821. The variable phase shifter 886 and the variable gain amplifier 825 together form a variable amplitude-phase module 822. The variable phase shifter 17 and the variable gain amplifier 15 together form a variable amplitude-phase module 823. One of ordinary skill in the art will also recognize that the order of the phase shifter and amplifier in the variable amplitude-phase modules 821–823 can be reversed.

The system 800 operates in a manner similar to that of the IM cancellation circuit shown in FIG. 5. The spectrum analyzer 9 receives a portion of the signal 4. The signal 4 contains desired components and undesired components (e.g., IM products). The spectrum analyzer analyzes the signal 4 and identifies the desired and undesired components by frequency, phase, and amplitude. Information on the frequency, phase, and amplitude of the signal components is provided to the processor 11. The processor 11 adjusts the phase of the variable phase shifter 875 such that the signal provided to the first input of the combiner 79 is approximately 180 degrees out of phase with respect to the signal provided to the second input of the combiner 79.

The processor 11 adjusts the gain of the variable-gain amplifier 810 such that the signal provided to the first input of the combiner 79 has approximately the same amplitude as the signal provided to the second input of the combiner 79. The signal provided to the first input of the combiner 79 includes the desired signal components but does not include IM products generated by the amplifier 77. The signal provided to the second input of the combiner 79 includes the desired signal components and the undesired signal components. Since the signals at the two inputs of the combiner 79 are approximately 180 degrees out of phase, the first combiner output signal 80 is an error signal that contains, primarily, IM products generated by the amplifier 77 (with a relatively small, and unwanted, residual portion that corresponds to the desired signal components). The variable-gain amplifier 810 is optional. The variable-gain amplifier 810 allow better control of the signal provided to the first input of the combiner 79. Proper adjustment of the gain of the variable-gain amplifier 810 helps to reduce the amplitude of the residual portion of the error signal. The gain of the variable-gain amplifier can be controlled by the processor 11 as shown in FIG. 8, or can be set manually.

By controlling the variable phase shifter 886 and the variable gain amplifier 81, the processor 11 adjusts the phase and amplitude of the signal 825. The phase of the signal 825 is adjusted so that it is approximately 180 degrees out of phase with respect to the phase of the IM products in the output of the amplifier 77. The amplitude of the signal 825 is adjusted so that it is approximately equal to the amplitude of the IM products in the output of the amplifier 77. The combiner 85 combines the output of the amplifier 77 with the cancellation signal 825 to produce the output signal 4 having reduced IM products (owing to the 180 degree difference in the IM products of the amplifier output signal and the cancellation signal 825. In one embodiment, the IM products are reduced in a least mean square sense. In one embodiment, the IM products are reduced in a minimum power spectral density sense. In one embodiment, the IM products are reduced in a peak search sense, where the worst IM product spectral peaks are found and the processor adjusts the cancellation signal to reduce the worst of such peaks.

In the system 800, the relatively higher power phase shifter 83 is omitted, and a relatively lower power phase shifter 86 is inserted into the relatively lower-power signal path at the input of the amplifier 81. The IM products produced by the primary amplifier 77 are canceled, in part, by combining the cancellation signal 825 with the output of the primary amplifier 77. The cancellation is based on producing signal components in the signal 825 that are 180 degrees out of phase (but similar in amplitude and frequency) with respect to the undesired components of the output of the amplifier 77. Thus it is the relative phase of the IM signal components at the first input of the combiner 85 and the IM signal components at the second input of the combiner 85 that matters, not the absolute phase at the inputs of the combiner 85. The relative phase of the two inputs of the combiner 85 can be controlled by a phase shifter in either input of the combiner 85. The advantage of the phase shifter 86 over the phase shifter 83 is that the phase shifter 86 need only handle the relatively lower-power signal 80, whereas, the phase shifter 83 must be able the handle the full output power of the amplifier 77. The relatively lower power phase shifter 83 is typically less expensive, smaller, lighter, and more accurate than the relatively higher power phase shifter 83.

The cancellation signal 825 is a relatively broadband cancellation signal that can cancel IM products at many frequencies. The processor 11 also adjust the frequency of the VCO 13, the gain of the amplifier 15, and the phase of the phase shifter 17 to produce a relatively narrow-band cancellation signal 25 that has a desired frequency, amplitude, and phase. The frequency and amplitude of the signal 25 will be substantially equal to the frequency and amplitude of an unwanted IM component of the signal 4 at a specific frequency or relatively narrow-frequency band. The phase of the signal 25 will be substantially 180 degrees out of phase with respect to the unwanted IM component of the signal 4. The cancellation signal 25 is combined with the signal 4 to produce an output signal where the amplitude of the unwanted IM component of the signal 4 is reduced. Thus, the cancellation signal 25 is useful for dealing with specific IM products (e.g., spectral spurs) that, owing to their strength relative to other IM products, are not fully cancelled by the cancellation signal 825.

As shown in FIG. 3, the VCO 13, the variable-gain amplifier 15, and the variable phase shifter 17 can be replicated as many times as necessary to cancel other unwanted IM products.

Figure 9:
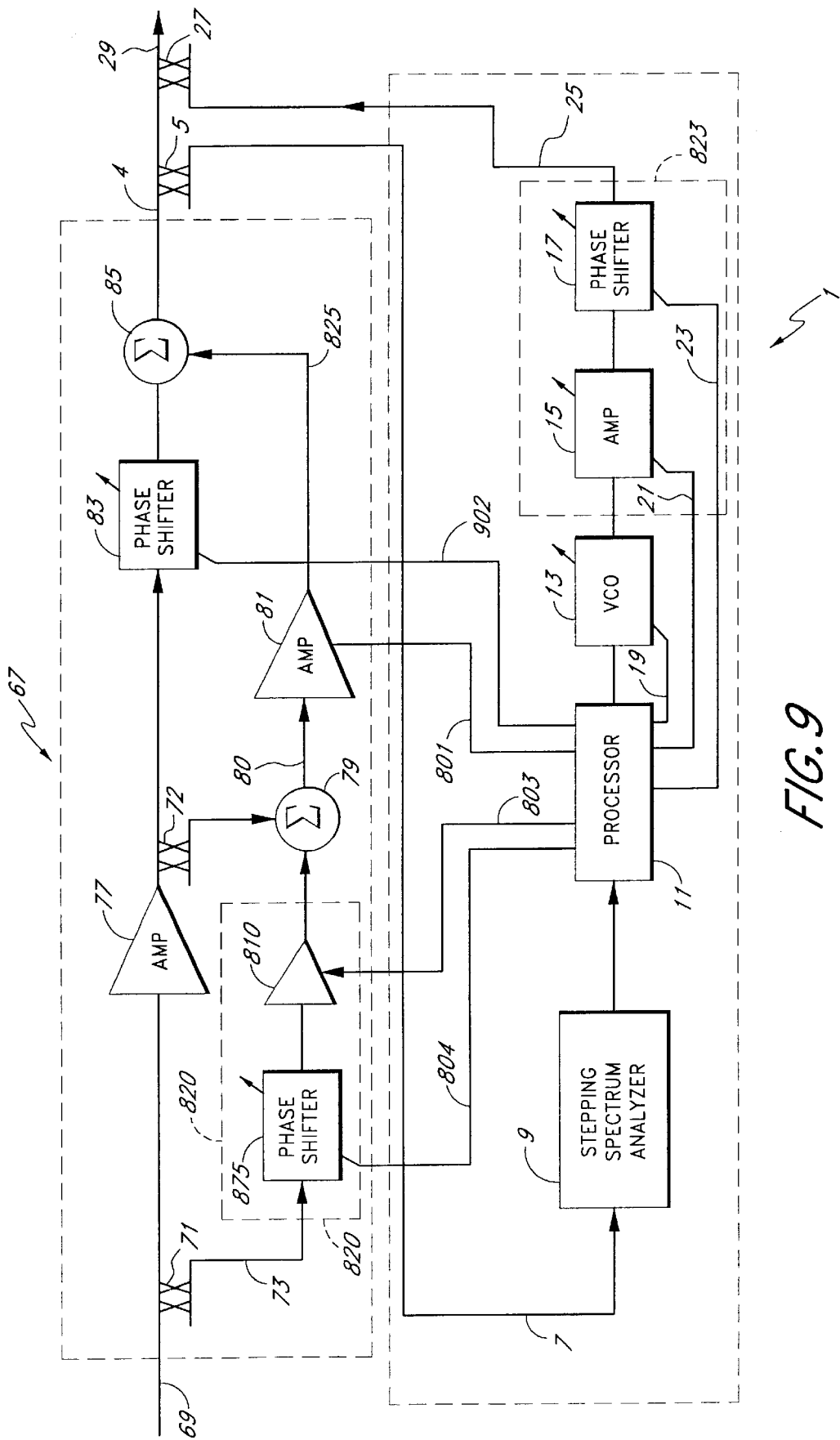
FIG. 9 is a block diagram shown an IM product cancellation system that includes an adjustable feed-forward circuit.

FIG. 9 shows an IM cancellation circuit similar to that shown in FIG. 8, except that the variable phase shifter 886 is removed and replaced by the phase shifter 83 connected between the output of the amplifier 77 and the second input of the combiner 85 (as in FIG. 5). The processor 11 controls the phase of the variable phase shifters 875, 83, and 17, the gain of the amplifiers 810, 81, and 15, and the frequency of the VCO 13. Operation of the IM cancellation circuit in FIG. 9 is similar to the operation of the IM cancellation circuit 800, with the 180 degree phase shift between the IM products provided to the two inputs of the combiner 85 is provided by the variable phase shifter 83.

The present invention has been described with reference to canceling IM products in RF signals. This description has been made because the present invention is considered to have particular relevance to RF systems. The IM product cancellation system can be used in many amplifier systems including communication systems, radar systems, satellite systems, and the like. However, the present invention is not intended to be limited to the radio frequency spectrum but is intended to include applications above the radio frequency spectrum including applications in the infrared, visible light, ultra-violet and x-ray spectrum such as fiber-optics and lasers.

Although this invention has been described in terms of certain embodiments, other embodiments apparent to those of ordinary skill in the art also are within the scope of this invention. Various changes and modifications may be made without departing from the spirit and scope of the invention. Accordingly, the scope of the invention is defined by the claims that follow.

What is claimed is:

1. An IM product cancellation system for reducing one or more IM products in an amplified signal, comprising:
    a first variable amplitude-phase module configured to receive a portion of an amplifier input signal and produce an adjusted signal having a desired amplitude and phase;
    a first combiner configured to combine at least a portion of an output signal from said amplifier with at least a portion of said adjusted signal to produce an error signal;
    a second variable amplitude-phase module configured to receive at least a portion of said error signal and produce a cancellation signal having a desired amplitude and phase;
    a second combiner configured to combine at least a portion of said output signal from said amplifier with at least a portion of said cancellation signal to produce an improved output signal; and
    a spectrum analyzer configured to receive a portion of said improved output signal as a spectrum analyzer input signal and provide information regarding spectral content of said improved output signal to a processor, said processor configured to control said first variable amplitude-phase module and said second variable amplitude-phase module to reduce unwanted IM products in said improved output signal.

2. The IM product cancellation circuit of claim 1, wherein said spectrum analyzer is capable of controllably stepping across a desired frequency band for recognizing and measuring characteristics of said improved output signal within that frequency band.

3. The IM product cancellation circuit of claim 1, wherein said processor includes a look-up table providing information regarding desired characteristics of a carrier signal for enabling the processor to determine the existence of unwanted EM products by comparison of the results of the analysis by said spectrum analyzer with information stored in said look-up table.

4. The IM product cancellation circuit of claim 3, wherein information stored in said look-up table is provided by analysis of said carrier signal prior to said carrier signal entering said amplifier.

5. The IM product cancellation circuit of claim 1, wherein in said amplifier is a power amplifier.

6. The IM product cancellation circuit of claim 1, wherein said spectrum analyzer quadrature mixes a desired portion of said spectrum analyzer input signal to baseband before analog to digital conversion.

7. The IM product cancellation circuit of claim 6, wherein said spectrum analyzer comprises:
    a low noise frequency source to produce a first low-noise signal at a first frequency and a second low-noise signal at substantially said first frequency;
    a coupler configured to combine said first low-noise signal with said spectrum analyzer input signal to produce a combined signal; and
    a mixer configured to mix a phase-shifted portion of said second low-noise signal with said combined signal to produce a downconverted signal.

8. The IM product cancellation circuit of claim 1, further comprising:
    a first controlled frequency source to produce a first sine wave;
    a third variable amplitude-phase module configured to adjust an amplitude and a phase of said first sine wave to produce a first correction signal; and
    a coupler configured to combine said first correction signal with said improved output signal.

9. The IM product cancellation circuit of claim 8, further comprising:
    a second controlled frequency source to produce a second sine wave; and
    a fourth variable amplitude-phase module configured to adjust an amplitude and a phase of said second sine wave to produce a second correction signal.

10. An IM product cancellation system, comprising:
    a first variable phase shifter configured to receive a portion of an amplifier input signal and produce an adjusted signal having a desired phase;
    a first combiner configured to combine at least a portion of an output signal from said amplifier with at least a portion of said adjusted signal to produce an error signal;
    a first variable amplitude-phase module configured to receive at least a portion of said error signal and produce a cancellation signal having a desired amplitude an and phase;
    a second combiner configured to combine at least a portion of sad output signal from said amplifier with at least a portion of said cancellation signal to produce an improved output signal; and
    a spectrum analyzer configured to receive a portion of said improved output signal as a spectrum analyzer input signal and provide information regarding spectral content of said improved output signal to a processor, said processor configured to control said first variable phase shifter and said first variable amplitude-phase module to reduce unwanted IM products in said improved output signal.

11. The IM product cancellation circuit of claim 10, wherein said spectrum analyzer is capable of automatically stepping across a desired frequency band for recognizing and measuring characteristics of said improved output signal within that frequency band.

12. The IM product cancellation circuit of claim 10, wherein said processor includes a look-up table providing information regarding desired characteristics of a carrier signal for enabling the processor to determine the existence of unwanted IM products by comparison of the results of the analysis by said spectrum analyzer with information stored in said look-up table.

13. The IM product cancellation circuit of claim 12, wherein information stored in said look-up table is provided by analysis of said carrier signal prior to said carrier signal entering said amplifier.

14. The IM product cancellation circuit of claim 10, wherein said spectrum analyzer quadrature mixes a desired portion of said spectrum analyzer input signal to baseband before analog to digital conversion.

15. The IM product cancellation circuit of claim 14, wherein said spectrum analyzer comprises:
a low noise frequency source to produce a first low-noise signal at a first frequency and a second low-noise signal at substantially said first frequency;
a coupler configured to combine said first low-noise signal with said spectrum analyzer input signal to produce a combined signal; and
a mixer configured to mix a phase-shifted portion of said second low-noise signal with said combined signal to produce a downconverted signal.

16. The IM product cancellation circuit of claim 10, further comprising:
a first controlled frequency source to produce a first sine wave;
a third variable amplitude-phase module configured to adjust an amplitude and a phase of said first sine wave to produce a first correction signal; and
a coupler configured to combine said first correction signal with said improved output signal.

17. The IM product cancellation circuit of claim 16, further comprising:
a second controlled frequency source to produce a second sine wave; and
a fourth variable amplitude-phase module configured to adjust an amplitude and a phase of said second sine wave to produce a second correction signal.

18. An IM product cancellation system for reducing one or more IM products in an amplified signal, comprising:
means for generating an error signal;
means for adjusting an amplitude and a phase of said error signal to produce a cancellation signal;
a combiner to combine said cancellation signal with an output of an amplifier to produce an improved signal;
means for analyzing a spectrum of said improved signal to produce analysis data; and
a processor configured to use said analysis data to control said means for generating and said means for adjusting.

19. An IM product cancellation system for reducing one or more IM products in an amplified signal, comprising:

means for generating an error signal;
means for converting said error signal into a relatively broadband cancellation signal;
a combiner to combine said cancellation signal with an output of an amplifier to produce an improved signal;
means for analyzing a spectrum of said improved signal to produce analysis data; and
a processor configured to use said analysis data to generate control information, said control information used to improve an accuracy of said error signal and said cancellation signal.

20. The IM product cancellation system of claim 19, further comprising:
means for generating one or more relatively narrow-band correction signals; and
a combiner to combine said one or more relatively narrow-band correction signals with said improved signal.

21. A method for reducing one or more IM products in an amplified signal, comprising:
selecting a portion of an input signal as a selected input portion;
adjusting a phase of said selected input portion to produce an adjusted signal;
selecting a portion of an amplifier output signal as a selected output portion;
combining said selected output portion and said adjusted signal to produce an error signal;
adjusting a phase and an amplitude of said error signal to produce a cancellation signal;
combining said cancellation signal with said amplifier output signal to produce an improved amplifier output signal;
analyzing spectral content of said improved amplifier output signal to produce analysis data;
using said analysis data to modify at least one of said phase of said selected input portion, said phase of said cancellation signal, and said amplitude of said cancellation signal.

22. The method of claim 21, further comprising adjusting an amplitude of said selected input portion.

23. The method of claim 21, wherein using said analysis data comprises using a look-up table providing information regarding desired characteristics of a carrier signal to determine the existence of unwanted IM products by comparing said analysis data with information stored in said look-up table.

24. The method of claim 21, further comprising quadrature mixing a selected portion of said improved amplifier output signal to baseband.

25. The method of claim 21, further comprising:
generating a first low-noise signal at a first frequency and a second low-noise signal at substantially said first frequency;
combining said first low-noise signal with a portion of said improved amplifier output signal to produce a combined signal; and
mixing a phase-shifted portion of said second low-noise signal with said combined signal to produce a downconverted signal.

26. The method of claim 21, further comprising:
generating a first sine wave signal;

adjusting a phase and an amplitude of said first sine wave signal to produce a first correction signal; and combining said first correction signal with said improved amplifier output signal.

27. The method of claim 26, further comprising:

generating a second sine wave signal;

adjusting a phase and an amplitude of said second sine wave signal to produce a second correction signal; and combining said second correction signal with said improved amplifier output signal.

* * * * *